(12) United States Patent
Beach et al.

(10) Patent No.: US 7,403,094 B2
(45) Date of Patent: Jul. 22, 2008

(54) THIN FILM RESISTOR AND DUMMY FILL STRUCTURE AND METHOD TO IMPROVE STABILITY AND REDUCE SELF-HEATING

(75) Inventors: Eric W. Beach, Tucson, AZ (US); Walter B. Meinel, Tucson, AZ (US); Philipp Steinmann, Unterschleissheim (DE)

(73) Assignee: Texas Instruments Incorporated, Dallas, TX (US)

( * ) Notice: Subject to any disclaimer, the term of this patent is extended or adjusted under 35 U.S.C. 154(b) by 174 days.

(21) Appl. No.: 11/103,203

(22) Filed: Apr. 11, 2005

(65) Prior Publication Data

US 2006/0238292 A1    Oct. 26, 2006

(51) Int. Cl.
*H01C 1/012*    (2006.01)
(52) U.S. Cl. ...................... 338/309; 257/536
(58) Field of Classification Search ............... 338/22 R, 338/308–314; 257/536, 775
See application file for complete search history.

(56) References Cited

U.S. PATENT DOCUMENTS 5,763,955 A * 6/1998 Findley et al. .............. 257/775
6,818,966 B2   11/2004 Beach et al. ................ 257/536

* cited by examiner

*Primary Examiner*—Elvin Enad
*Assistant Examiner*—Joselito Baisa
(74) *Attorney, Agent, or Firm*—Wade J. Brady, III; Frederick J. Telecky, Jr.

(57) ABSTRACT

An integrated circuit thin film resistor structure includes a first dielectric layer (18A) disposed on a semiconductor layer (16), a first dummy fill layer (9A) disposed on the first dielectric layer (18B), a second dielectric layer (18C) disposed on the first dummy fill layer (9A), the second dielectric layer (18B) having a first planar surface (18-3), a first thin film resistor (2) disposed on the first planar surface (18-3) over the first dummy fill layer (9A). A first metal interconnect layer (22A,B) includes a first portion (22A) contacting a first head portion of the thin film resistor (2). A third dielectric layer (21) is disposed on the thin film resistor (2) and the first metal interconnect layer (22A,B). Preferably, the first thin film resistor (2) is symmetrically aligned with the first dummy fill layer (9A). In the described embodiments, the first dummy fill layer is composed of metal (integrated circuit metallization).

19 Claims, 3 Drawing Sheets

THIN FILM RESISTOR AND DUMMY FILL STRUCTURE AND METHOD TO IMPROVE STABILITY AND REDUCE SELF-HEATING

BACKGROUND OF THE INVENTION

The present invention relates generally to semiconductor devices and techniques for providing dummy fill structures beneath thin film resistors that preferably are symmetric with respect to the thin film resistors, so as to reduce self-heating, preferably uniformly, of the thin film resistors and improve the stability of the thin film resistors, especially the stability of ratios of resistances of thin film resistors having different current densities therein.

"Dummy fill" has been commonly utilized in conjunction with use of chemical mechanical polishing (CMP) in integrated circuit chip fabrication processes. Dummy fill also has been utilized beneath an array of thin film resistors to disperse laser beam energy reflected during trimming of the thin film resistors so as to reduce optical interference of reflected laser energy with the incident laser beam and thereby improve laser trimming of the thin film resistors, as described in commonly assigned U.S. Pat. No. 6,818,966 issued Nov. 16, 2004 to Beach et al. In CMP processes, it is necessary to have an adequate density of the materials being polished to avoid localized over-polishing, referred to as "dishing", which results in a non-planar surface after the polishing. Non-planar surfaces are incompatible with many conventional integrated circuit processing steps. For example, if interconnect metallization is deposited on a non-planar surface and the resulting surface then is subjected to a CMP operation, there may be residues of undesired metallization which are not adequately removed. Such undesired metallization residues may cause electrical shorting or other problems that lower integrated circuit processing yield.

When CMD operations are performed in the vicinity of thin film resistors, the "dishing" referred to above may cause large "systematic" errors in the resistances and ratio-matching of resistances of the thin film resistors. This is because stress associated with the thin film resistive material, especially SiCr which is somewhat piezo-resistive, causes identical SiCr resistor segments to have slightly different resistances, due in part to the variation in piezo-resistivity. Not only is the resistance of every identical resistor or resistor segment different for different die and different wafers, the systematic error associated with the resistor segments typically varies significantly even within the same die.

For prior art integrated circuit surface planarizing processes, it was considered unacceptable to have any metal or any other abrupt integrated circuit topology features located underneath thin film resistors. This was because the prior art integrated circuit surface planarizing processes could not adequately planarize or precisely flatten such topology features well enough to avoid severe disruption of the matching and stability of the thin film resistors due to material stresses and/or discontinuities (especially in very thin layers such as SiCr which, for example, may be only about 30 Angstroms thick) and/or optical inaccuracies associated with photolithography techniques being used.

FIG. 5 shows an accurate section view of a portion of a prior art integrated circuit including a prior art thin film resistor structure in which a sichrome (SiCr) thin film resistor 2 is formed on a chemically and a mechanically polished surface of an "interlevel dielectrics" layer or region 21 which includes several conventional dielectric layers (not shown). Layer 21 is formed over a "pre-metal dielectrics" layer 18, which is formed on a silicon layer 16. Silicon layer 16 may be formed on a silicon wafer substrate. (The term "pre-metal dielectrics" is well-known in the integrated circuit industry, and refers to contiguous different pre-metal dielectric layers having somewhat different doping, including, for example, for example, boron-phosphorus "TEOS" (tetrethylorthosilicate) layers.) Thin film resistor "head" 22A may be composed of TiW (titanium-tungsten) which extends through an opening in a dielectric sub-layer of oxide region 20 to make electrical contact with the left end or head of SiCr resistor 2, and also makes contact with a portion 24A of a metallization layer 24A,B, typically formed of aluminum, formed on the upper surface of interlevel dielectric region 21. In a similar manner, a separate portion 24B of metallization layer 24A,B makes electrical contact to the right end or head of SiCr resistor 2. Interconnect "Metal 2" conductors 24A and 24B extend along the surface of dielectric layer 21 and are connected to electrodes of various circuit elements (not shown) such as transistors, capacitors, and resistors, and may also be connected by appropriate conductive vias to "Metal 1" conductors such as conductor 9.

Thus, there is an unmet need for an improved, inexpensive integrated circuit thin film resistor structure and method for reducing or eliminating inaccuracy in the resistances and ratios of the resistances of thin film resistors.

There also is an unmet need for an improved, inexpensive integrated circuit thin film resistor structure and method for reducing or eliminating inaccuracy in the ratios of resistances of thin film resistors having substantially different current densities therein.

There also is an unmet need for an improved, inexpensive integrated circuit thin film resistor structure and method for reducing self-heating of a thin film resistor and causing self-heating that does occur to be uniform.

There also is an unmet need for an improved, inexpensive integrated circuit thin film resistor structure and method for improving nucleation of resistive material being deposited on abraded dielectric surfaces.

SUMMARY OF THE INVENTION

It is an object of the invention to provide an improved, inexpensive integrated circuit thin film resistor structure and method for reducing or eliminating inaccuracy in the resistances and ratios of the resistances of thin film resistors.

There also is an unmet need for an improved, inexpensive integrated circuit thin film resistor structure and method for reducing or eliminating inaccuracy in the ratios of resistances of thin film resistors having substantially different current densities therein.

It is another object of the invention to provide an improved, inexpensive integrated circuit thin film resistor structure and method for reducing self-heating of a thin film resistor by uniformly reducing thermal resistance to a silicon substrate.

It is another object of the invention to provide an improved, inexpensive integrated circuit thin film resistor structure and method providing improved nucleation of thin film resistive material on dielectric material on which the thin film resistive material is formed.

It is another object of the invention to provide an improved, inexpensive integrated circuit thin film resistor structure and method for improving nucleation of resistive material being deposited on damaged dielectric surfaces.

Briefly described, and in accordance with one embodiment, the present invention provides a thin film resistor structure including a first dielectric layer (18A) disposed on a semiconductor layer (16), a first dummy fill layer (9A) disposed on the first dielectric layer (18B), a second dielectric layer (18C) disposed over the first dummy fill layer (9A), the second dielectric layer (18B) having a first planar surface (18-3), a thin film resistor (2) disposed on the first planar surface (18-3) over the first dummy fill layer (9A), a first metal interconnect layer (22A,B) including a first portion (22A) contacting a first head portion of the thin film resistor (2), and a third dielectric layer (21) disposed on the thin film resistor (2) and the first metal interconnect layer (22A,B). Preferably, the thin film resistor (2) is symmetrically aligned with the first dummy fill layer (9A). In the described embodiments, the first dummy fill layer is composed of metal (integrated circuit metallization). In the described embodiments, the first dummy fill layer (9A) includes a repetitive pattern that is precisely aligned with edges of the thin film resistor (2), and in a preferred embodiment the repetitive pattern is precisely aligned in two orthogonal directions with orthogonal edges, respectively, of the thin film resistor (2). A second dummy fill layer (9B) disposed on a third dielectric layer (18A) located under the first dielectric layer (18B). In a described embodiment, the first dummy fill layer (9A) is metal and the second dummy fill layer (9B) is polycrystalline silicon. A fourth dielectric layer (18C) can be disposed on the first dummy fill layer (9A), wherein the fourth dielectric layer (18C) has a chemically and mechanically polished surface (18-3) and wherein the second dielectric layer (18D) is deposited on the chemically and mechanically polished surface (18-3).

In a described method of making an integrated circuit thin film structure a first dummy fill layer (9A) is formed on a planar surface (18-2) of a first dielectric layer (18B), a second dielectric layer (18C) is formed on the first dummy fill layer (9A), and a surface (18-3) of the second dielectric layer (18C) is planarized by chemical mechanical polishing. A thin film resistor (2) is formed on the planar surface (18-3) of the second dielectric layer (18C). A first inter-level dielectric layer (21A) is formed on the planar surface (18-3) of the second dielectric layer (18C) and the thin film resistor (2). Then a first metal layer (22A,B) is formed on the first inter-level dielectric layer (21A), wherein a first portion (22A) of the first metal layer electrically contacts a portion of the thin film resistor (2) through a contact opening in the first inter-level dielectric layer (21A). A second interlevel dielectric layer (21B) is formed on the first interlevel dielectric layer (21A) and first metal layer (22A,B). A second metal layer (24A,B) is formed on the second interlevel dielectric layer (21B) are in a first portion (24A) of the second metal layer is electrically coupled through a via (23A) to the first portion (22A) of the first metal layer.

DETAILED DESCRIPTION OF THE PREFERRED EMBODIMENTS

Figure 1:
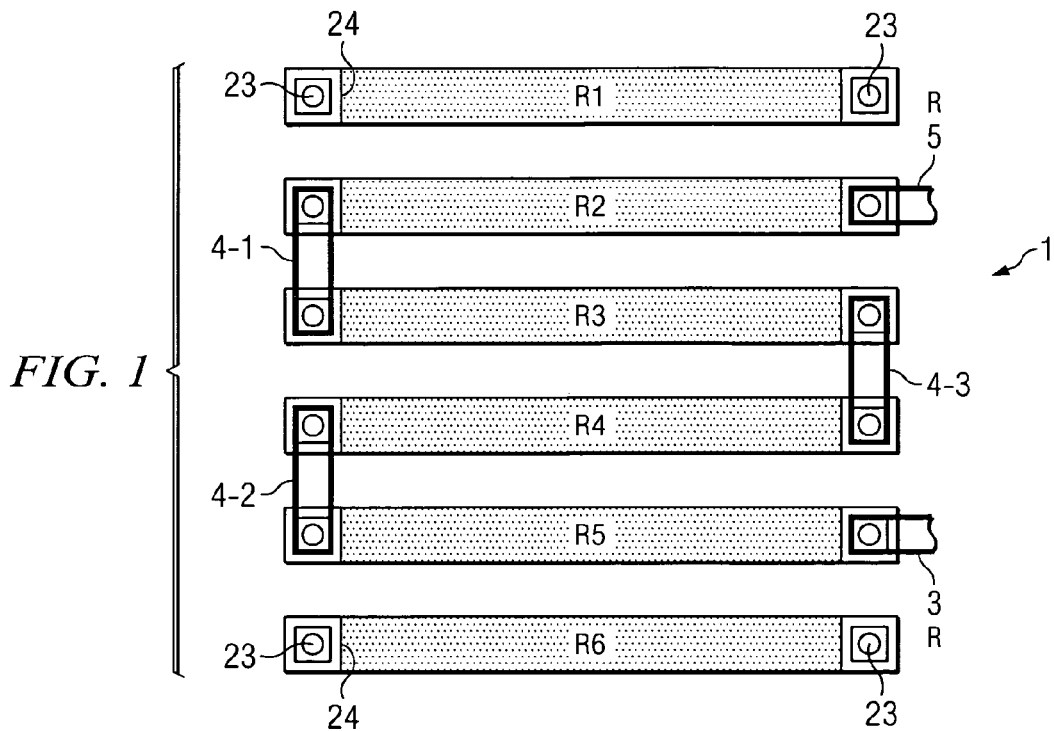
FIG. 1 is a plan view diagram of an integrated circuit thin film resistor structure.

FIG. 1 shows a plan view of an integrated circuit resistor structure 1 including elongated, rectangular resistive film segments or resistors R1,2 . . . 6 composed of thin film material such as SiCr (sichrome). The segments R1,2 . . . 6 all are essentially identical in length, width, and spacing between the segments. A metal terminal 5 is connected through a tungsten via or plug 23 to a thin film resistor "head" 24 of thin film resistor segment R2. Thin film resistor head 24 typically is composed of TiN (titanium-nitride). The left end of resistor segment R2 is connected in the same manner to one end of a metal connector 4-1, the other end of which is connected through a tungsten plug and a TiN head to the left end of resistor segment R3, the right end of which is connected by metal connector 4-3 to the right end of resistor segment R4. Similarly, segments R4 and R5 are connected in series with segments R3 and R4 and with terminals 3 and 5 to form a "composite" thin film resistor having a total resistance R between terminals 3 and 5. It should be noted that resistor segments R1 and R6 are "dummy" resistor segments which are provided only for the purpose of reducing/eliminating "edge effects" of segments R2 and R3 on the total resistance R. Resistor segments R1-6 also could be composed of other common thin film resistive material, such as nichrome (NiCr), alloys of SiCr or NiCr, tantalum nitride (TaN), and/or alloys of TaN.

Figure 2:
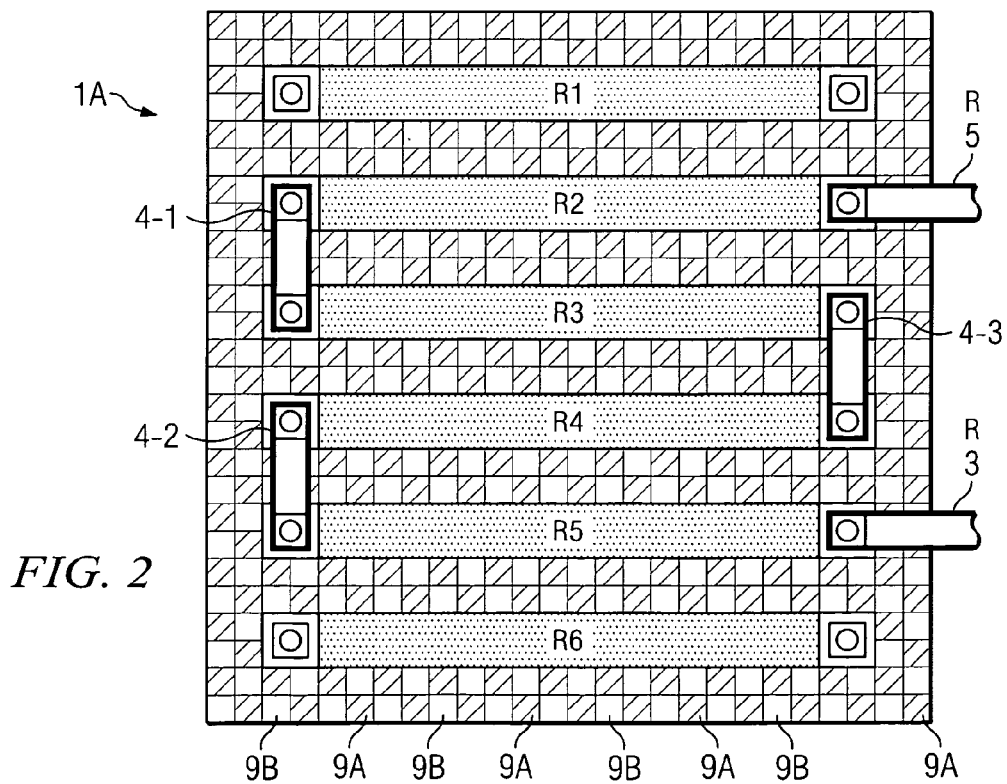
FIG. 2 is a plan view diagram of the thin film resistor shown in FIG. 1 with a checkerboard metal and polycrystalline silicon dummy fill structure underlying and somewhat asymmetric with respect to the thin film resistor.

FIG. 2 shows a plan view of an experimental integrated circuit resistor structure 1A which includes the elongated, rectangular SiCr segments R1,2 . . . 6 of prior art FIG. 1 that are identical in length, width, and spacing. As in prior art FIG. 1, metal terminal 5 in FIG. 2 is connected by tungsten plug 23 and thin film TiN resistor head 24 to the right end of resistor segment R2, the left end of resistor segment R2 being similarly connected by metal (typically aluminum) connector 4-1 to the left end of resistor segment R3, the right end of which is connected by metal connector 4-3 to the right end of resistor segment R4. The left end of resistor segment R4 is connected by metal connector 4-2 to the left end of resistor segment R5, the right end of which is connected to metal terminal 3, such that segments R2-5 constitute a "composite" SiCr resistor having a total resistance R between terminals 3 and 5. Resistor segments R1 and R6 are "dummy" resistor segments for reducing "edge effects" of segments R2 and R5 on the total resistance R.

In FIG. 2, and in accordance with the present invention, a first dummy fill layer including a checkerboard pattern of polycrystalline silicon squares 9B is formed in a first dielectric layer or region underneath the composite resistor R including resistor segments R1-6, and a second dummy fill layer including another checkerboard pattern of metal (typically aluminum) squares 9A aligned with the "gaps" in the polycrystalline silicon checkerboard pattern 9B is formed in a second dielectric layer formed above the first dielectric layer but underneath composite resistor R. However, the "pitch" or periodicity of the checkerboard patterns 9A and 9B in FIG. 2 is not consistent with the length, width, and spacing of resistor segments R1-6, and this inconsistency between the periodicity of the locations of the checkerboard patterns 9A and 9B and the periodicity of the locations of the resistor segments R1-6 results in non-uniform thermal resistance paths from the various resistor segments R1-6 to the substrate and hence also results in non-uniform self-heating of the resistor segments. The pitch or periodicity of the dummy fill pattern being inconsistent with the length, width, and spacing of resistor segments R1-6 also causes non-uniform stresses in resistor segments R1-6, thereby leading to errors in the resistances thereof and errors in the ratios of the resistances thereof.

Figure 3:
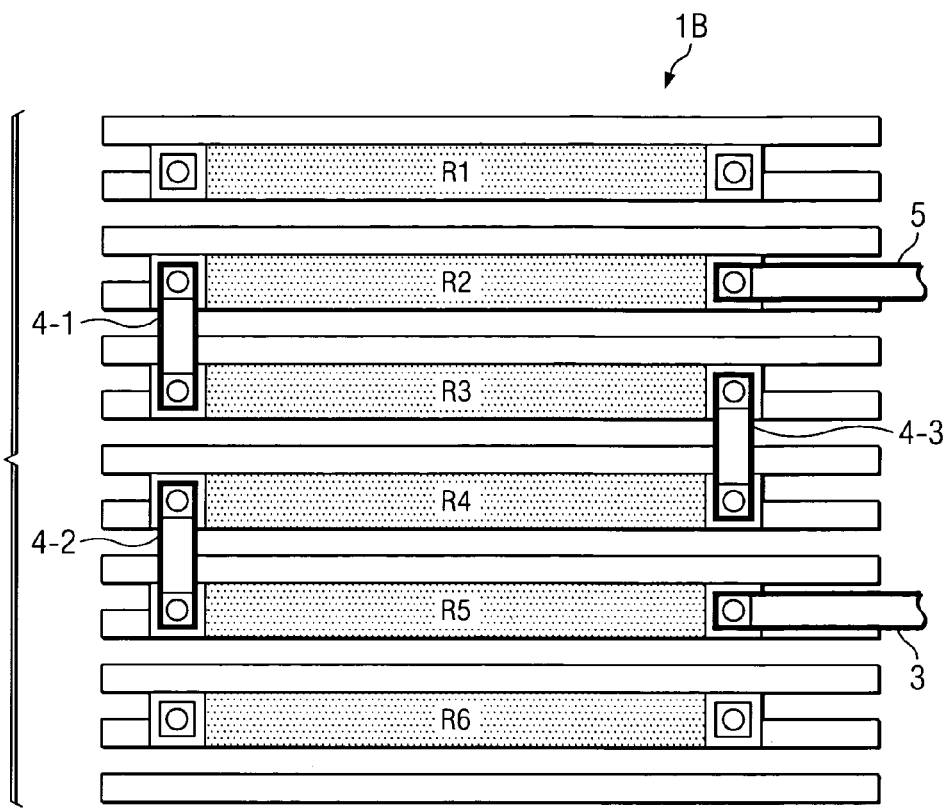
FIG. 3 is a plan view diagram of the thin film resistor shown in FIG. 1 with a different metal dummy fill structure underlying and somewhat asymmetric with respect to the thin film resistor.

FIG. 3 shows another experimental integrated circuit resistor structure 1B which includes the same SiCr segments R1-6 as in FIG. 2, but in FIG. 3 only a single dummy fill layer is formed underneath resistor segments R1-6, and is composed of identical elongated, parallel, equally spaced metal strips 9B which are parallel to resistor segments R1-6, as shown. Again, the "pitch" or periodicity of the parallel metal strips 9B is not consistent with the length, width, and spacing of resistor segments R1-6.

Figure 4:
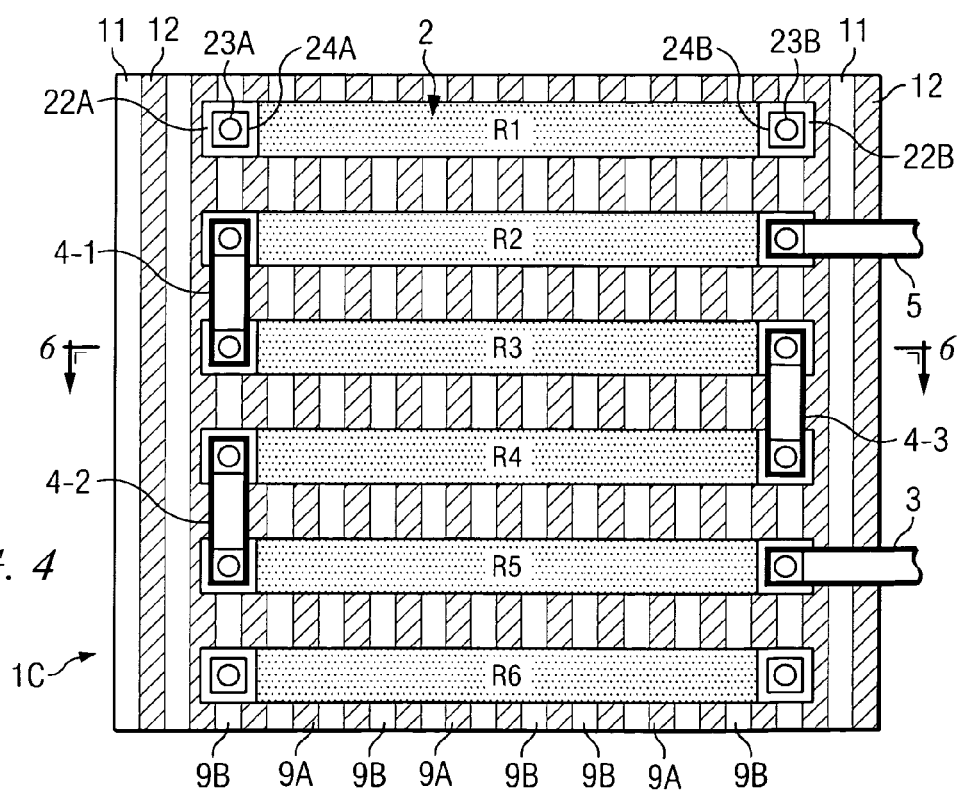
FIG. 4 is a plan view diagram of the thin film resistor shown in FIG. 1 with a metal and polycrystalline silicon dummy fill structure underlying and completely symmetric with respect to the thin film resistor.
Figure 5:
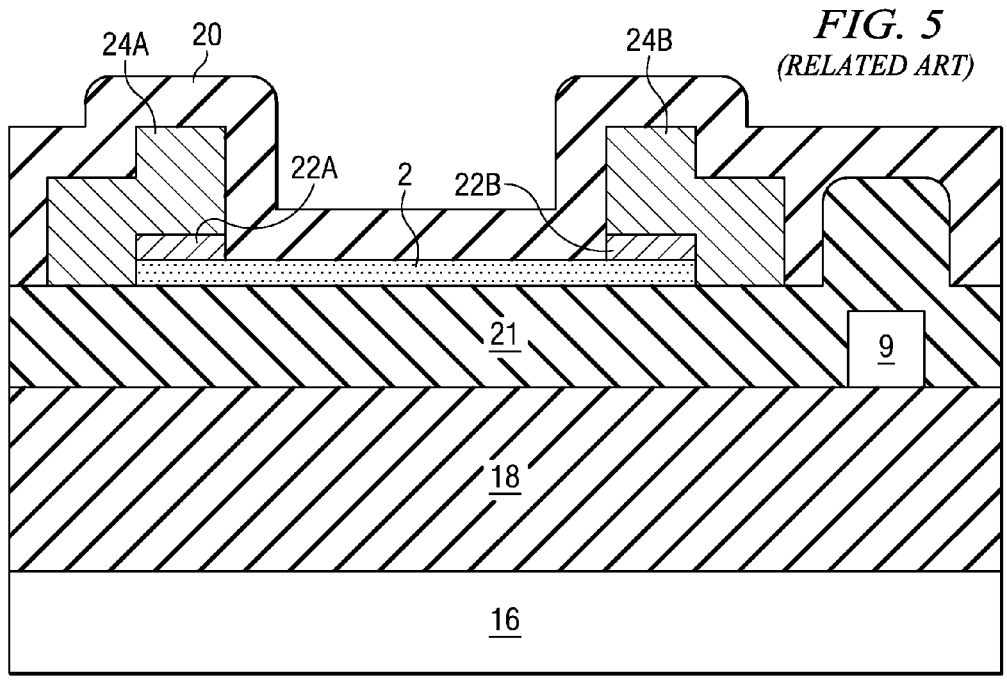
FIG. 5 is a section view of a conventional integrated circuit structure including a thin film sichrome resistor which gives rise to the problem solved by the present invention.

Referring to FIG. 4, another experimental integrated circuit resistor structure 1C is shown which includes the same SiCr segments R1-6 as in FIG. 2. In FIG. 4, the polycrystalline silicon dummy fill layer is composed of identical elongated, parallel, equally spaced polycrystalline silicon strips 9B which are perpendicular to the longitudinal axes of resistor segments R1-6. Also, the metal dummy fill layer in FIG. 4 is composed of identical elongated, parallel, equally spaced metal strips 9A which are aligned with the spaces between the lower, previously formed polycrystalline silicon strips 9B. However, in FIG. 4 the "pitch" or periodicity of both the parallel polycrystalline silicon strips 9A and the parallel metal strips 9B is symmetric with respect to the length of resistor segments R1-6, and the length of the strips 9A and 9B is symmetric with respect to the width of the thin film resistor structure 1C.

The composite dummy fill structure consisting of both the polycrystalline silicon strips 9B and the metal strips 9A extends symmetrically beyond both sides and both ends of the integrated circuit resistor structure 1C. Since it is not really possible to achieve perfect alignment or registration of edges of the "composite" dummy fill structure 9A,9B with edges of the resistor segments R1-6, any misalignment would inherently cause some resistivity error in the resistor segments R1-6. Therefore, it is desirable to extend the dummy fill pattern in FIG. 4 beyond the ends of resistor segments R1-6 by an amount equal, for example, to one "pitch period" plus 3 standard deviations of the misalignment amount for the integrated circuit mask alignment machinery being utilized. The use of the dummy fill layers contributes to achieving the needed planarity of the various layers prior to forming another layer thereon, and also contributes to reducing and balancing of stresses in the materials, especially in the thin film resistors.

In the experimental dummy fill resistor structures 1A and 1B of FIGS. 2 and 3, the positioning of the dummy fill patterns was not precisely symmetrical in all directions with respect to the SiCr segments R1-6.

In order to obtain a comparison of the effects of using and not using dummy fill under SiCr thin film resistors, and also to obtain a comparison of different dummy fill configurations, a single mask set was made and utilized to make integrated circuit die, each of which included all of the thin film resistor structures shown in FIGS. 1-4. The die were subjected to a temperature of more than 150 degrees Centigrade for approximately 4 hours during a standard packaging operation, and also were subjected to a standard "high-temperature operating life time" (HTOL time) testing procedure at 150 degrees Centigrade for 1264 hours. Then the ratios of the resistances of various identical pairs of the resistors R of each of the structures of FIGS. 1-4 were measured and their relative stability was determined.

For the composite resistors R having the configuration shown in FIG. 1 with no dummy fill, it was discovered that the average stability of the ratios of resistances between identical pairs of the composite resistors R was −0.9 ppm, with a standard deviation of 5.9 ppm. For composite resistors having the thin film resistor and dummy fill configuration shown in FIG. 2, the average stability of the ratios of resistances between identical pairs of composite resistors R was −11.0 ppm, with a standard deviation of 16.4. For composite resistors having the thin film resistor and dummy fill configuration shown in FIG. 3, the average stability of the ratios of resistances between identical pairs of composite resistors R was 2.4 ppm, with a standard deviation of 11.4 ppm.

It should be noted that these errors are "systematic" errors that result in offsets or shifts of measured voltages that are small enough be readily recognized and corrected or compensated for by circuit designers associated random errors or "spread" are small enough to allow the systematic errors to be measured/recognized. More typically, the random errors have been so large that the systematic errors or offsets have not been recognized and therefore have not been corrected for or compensated. For example, at the present state-of-the-art it has not been possible to manufacture digital to analog converters with more than approximately 12 bit accuracy without use of slow, expensive laser trimming of thin film resistors. However, use of the present invention has allowed manufacture of digital to analog converters having 16 bit accuracy without laser trimming of thin film resistors.

For the symmetric dummy fill structure of FIG. 4, the average "HTOL stability" was found to be only −0.4 ppm with a standard deviation of 1.5 ppm, which is approximately 10 times more accurate than for the "asymmetrical" dummy fill layer arrangements shown in FIGS. 2 and 3. This average stability is even better than the average stability of arrangement of FIG. 1 in which no dummy fill is used. The operating life stability of the thin film resistor structure shown in FIG. 4 is greatly improved by providing the dummy fill strips 9A and 9B perpendicular to the longitudinal axes of resistor segments R1-6.

The metal dummy fill 9A is located in very close proximity to the thin film resistor and therefore has much greater desirable effect on self-heating and stability than the polycrystalline silicon dummy fill, which is located much further (almost two microns) below the thin film resistor and therefore is much less important with respect to self-heating of the resistor segments R2-5.

Figure 6:
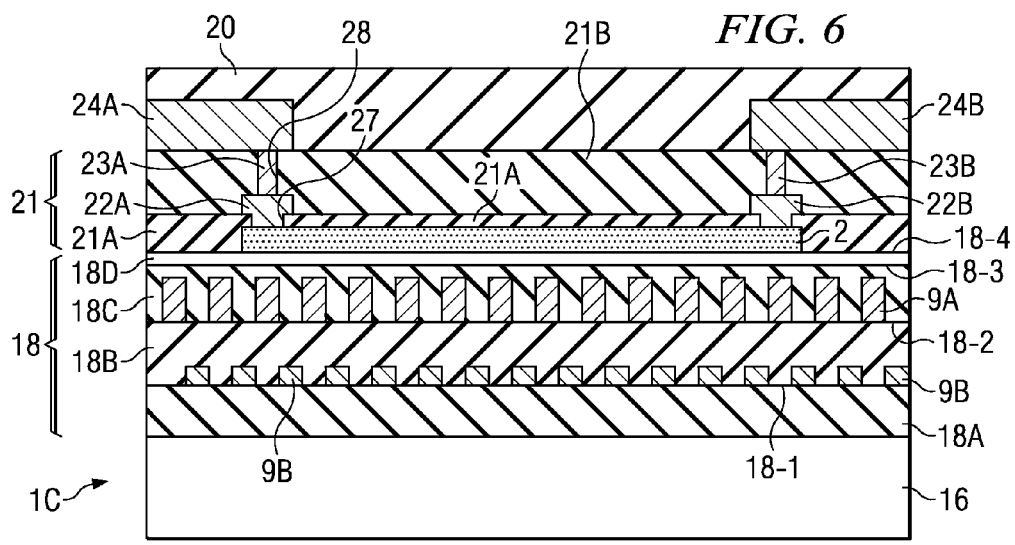
FIG. 6 is a section view along section line 6-6 of FIG. 4.

FIG. 6 shows a section view along section line 6-6 of thin film resistor structure 1C of FIG. 4. SiCr thin film resistor 2 is formed on pre-metal dielectric layer or region 18. In accordance with the present invention, one or more dummy fill layers, for example as shown FIG. 4, are provided within pre-metal dielectric layer or region 18.

Referring to FIG. 6, pre-metal dielectrics region 18 is formed on silicon substrate 16 (which could be an epitaxial silicon layer formed on a wafer). Region 18 includes a dielectric layer 18A formed on the upper surface of silicon layer 16. A precisely patterned layer of parallel, elongated, equally spaced, polycrystalline silicon strips 9B as shown in FIG. 4 is formed on the upper surface 18-1 of dielectric layer 18A to form a dummy fill layer 9B. The polycrystalline silicon strips 9B can be considered to be optional, but preferably are provided to provide a more uniform upper surface of pre-metal dielectrics layer 18. Another dielectric layer 18B is formed on polycrystalline silicon dummy fill layer 9B and the exposed portion of surface 18-1 of dielectric layer 18A.

A "Metal 1" layer of precisely patterned parallel, elongated, equally spaced aluminum metallization strips 9A as shown in FIG. 4 is formed on chemically and mechanically polished surface 18-2 of dielectric layer 18B to provide another dummy fill layer 9A, preferably using a HDP (high-density plasma) processes involving simultaneous depositing and etching processes to avoid "keyholes" or cracks between the narrowly spaced metal strips 9A so as to allow very uniform subsequent fill between them. A dielectric layer 18C is formed on the dummy fill layer 9A and the exposed portions of surface 18-2 of dielectric layer 18B. The upper surface 18-3 of dielectric layer 18C is planarized by a conventional CMP process. Preferably, a thin TEOS layer 18D is formed on chemically and mechanically polished surface 18-3 to provide a good non-abraded surface 18-4 on which to sputter or deposit SiCr thin film resistive material. Then SiCr resistor 2 is sputtered onto surface 18-4 in a conventional manner, and, as explained below, this is believed to result in substantially improved stability of the ratios of different resistors each composed of resistor segments such as R1-6.

The purpose of intrinsic or "clean" TEOS layer 18D is to provide un-damaged, i.e., non-abraded, oxide on which to sputter the SiCr, because chemically mechanically polished oxide always has an abraded, and therefore chemically damaged, surface. Although the chemically and mechanically polished oxide surface is extremely smooth, at an atomic level it is damaged such that there are chemical bonds that are not "passified" or "passivated". (For example, a silicon molecule of a smooth surface can have four bonding sites, and if one of those bonding sites is "dangling" or un-passified due to mechanical damage, then as layers of silicon are being deposited as nucleation occurs at the various silicon molecule bonding sites, there will be corresponding random unevenness in the silicon film being deposited instead of uniform, layer-by-layer deposition of silicon. Similarly, if the SiCr is sputtered directly on an unpassivated surface, the nucleation by means of which a thin, uniform layer of SiCr can be deposited onto a high-quality oxide film that has just been deposited will be more erratic and random than is the case if the SiCr is sputtered onto an undamaged, non-abraded oxide surface and will result in unpredictable, random resistivity variations in the SiCr thin film resistor. That will result in random variations in thickness and hence in resistivity at various sites within the thin film resistor. Stated differently, damaged or abraded oxide surface impedes smooth, continuous nucleation of thin film resistive material being deposited along the abraded oxide surface, resulting in random thick spots of reduced resistivity.)

A single, relatively wide section of metal dummy fill theoretically could be provided underneath the thin film resistor, but more uniform upper surfaces of the metal with less "peaking" and hillocking are achieved by providing spaced, narrow metal strips 9A as shown. (Hillocks are localized stress relief mechanisms in deposited metal layers to relieve tensile stress that occurs as the aluminum is deposited on a planar surface. As the aluminum layer is subjected to thermal cycles, the different temperature coefficients of expansion for the aluminum and the oxide layer on which it is deposited result in sideways or outward growth of grains of aluminum so as to relieve the tensile stresses. The growths are referred to as hillocks.)

In FIG. 6, an interlevel dielectrics region 21 includes a dielectric layer 21A formed on SiCr resistor 2 and on the exposed area of planarized surface 18-4 of TEOS layer 18D. A conventional thin film resistor head 22A composed of TiN extends through an opening 27 in dielectric layer 21A to make reliable electrical contact with the left end of SiCr resistor 2. Another dielectric layer 21B is formed on dielectric layer 21A. Resistor head 22A also makes reliable electrical contact with the bottom of a tungsten via or plug 23A which extends to the top of interlevel dielectric layer 21 through an opening 28 therein. A portion 24A of a metallization layer 24A,B formed on the upper surface of interlevel dielectric layer 21 electrically contacts the top of tungsten plug 23A. (By way of definition, the term "layer" as used herein is intended to include a layer having multiple sections which may be, but are not necessarily, connected and/or contiguous to each other. Thus, metallization layer 24A,B includes sections 24A and 24B which are not connected to each other and are not contiguous.)

In a similar manner, a separate portion 24B of metallization layer 24A,B makes electrical contact through tungsten plug 23B and TiN thin film head 22B to the right end of TiN resistor 2. (The terminology "Metal 2" refers to a second interconnect metallization layer formed in the integrated circuit manufacturing process, wherein a first interconnect metallization layer used in the process is referred to as the "Metal 1" layer, and is used to provide electrical connection between various terminals of transistors and various passive components (not shown in FIG. 6) such as capacitors, diffused resistors, thin film resistors, etc.) An "intrinsic" or clean TEOS layer 20 is formed on metallization layer 24A,B and dielectric layer 21B.

Figure 7:
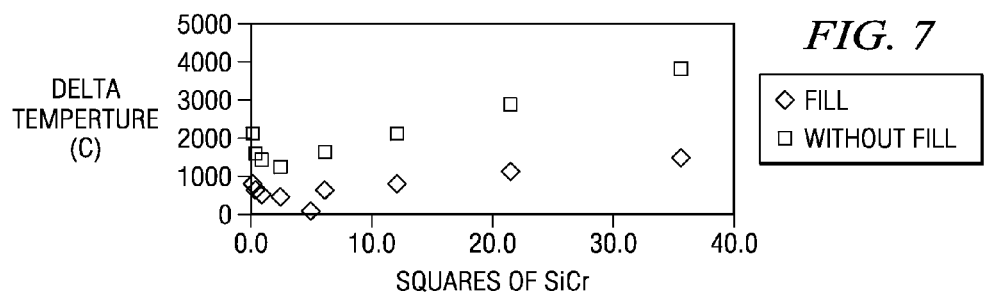
FIG. 7 is a graph useful in explaining the reduction in self-heating achieved using the structure of FIG. 4.

The symmetrical characteristic of the above described dummy fill layer 9A, and to a substantially lesser extent, layer 9B, may be important to reducing self-heating of the thin film resistors. This is because if the dummy fill is asymmetric, then the thermal resistivity of the thermal path from the thin film resistor to substrate is not uniform, and therefore self heating in the thin film resistors is be uniform, which causes geometry-determined systematic "hot spots" and associated resistivity accuracy errors therein. Providing a metal dummy fill under the thin film resistor, in effect, provides a heat sink from the resistor to the substrate, which greatly reduces the temperature increase. The self-heating effects also cause errors in matching of a thin film resistor having low current density with respect to a thin film resistor having high current density because there is greater change in sheet resistance in the thin film resistor that undergoes greater self-heating. The data illustrated in the graph of FIG. 7 shows a reduction by a factor of two in the amount of self heating by illustrating different temperature build up that occurs in a thin film resistor with dummy fill as shown in FIG. 4 and in an identical thin film resistor without dummy fill as shown in FIG. 1.

It should be appreciated that thin film resisters with higher current density will have more self-heating which can be problematic, but the same problems can occur if the current densities are equal but the thermal resistivities are different because of variations in the dummy fill underneath. Embodiments of the present invention with "symmetric" (with respect to the thin film resistor) dummy fill layers solve both problems. The symmetry helps minimize the impact of different current densities and equalizes the thermal resistivity underneath the thin film resistors.

Thus, the described embodiments of the invention improve the stability or matching between resistances of thin film resistors, including the ratio between a thin film resistor having a high current density and another thin film resistor having a low current density. The described embodiments of the invention also reduce self-heating of a thin film resistor and thereby contribute to improved stability or matching between resistors. The invention provides an improvement over the closest prior art by a factor of approximately 2 in the absolute stability of the ratio between thin film resistors and an improvement by a factor of approximately 4 in the variance of that stability. Furthermore, the physical size of the thin film resistor can be made smaller if self-heating effects therein can be reduced.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, even though only integrated circuit implementations of the invention have been described in detail, those skilled in the art could readily provide a discrete thin film resistor structure in accordance with the invention. Although the dummy fill layer closest to the thin film resistor is disclosed as being metal, if the thin film resistor were to be integrated below the Metal 1 layer, the closest dummy fill layer formed under the thin film resistor might be polycrystalline silicon.

What is claimed is:

1. A thin film resistor structure comprising:
   a first dielectric layer disposed over a semiconductor layer;
   a first dummy fill layer disposed on a planar surface of the first dielectric layer;
   a second dielectric layer disposed on the first dummy fill layer, the second dielectric layer having a chemically and mechanically polished surface;
   a third dielectric layer disposed over the first dummy fill layer and on the second dielectric layer, the third dielectric layer having a non-abraded, planar surface;
   a thin film resistor disposed on the non-abraded, planar surface of the third dielectric layer over the first dummy fill layer;
   a first metal interconnect layer including a first portion electrically contacting a first head portion of the thin film resistor; and
   a fourth dielectric layer disposed on the thin film resistor.

2. The thin film resistor structure of claim 1 wherein the thin film resistor is symmetrically aligned with the first dummy fill layer.

3. The thin film resistor structure of claim 2 wherein the first dummy fill layer is composed of metal.

4. The thin film resistor structure of claim 2 wherein the first dummy fill layer includes a repetitive pattern that is symmetrically aligned with respect to multiple edges of the thin film resistor.

5. The thin film resistor structure of claim 3 wherein the repetitive pattern is symmetrically aligned in two orthogonal directions with orthogonal edges, respectively, of the thin film resistor.

6. The thin film resistor structure of claim 1 wherein the third dielectric layer is a tetraethylorthosilicate layer.

7. The thin film resistor structure of claim 4 including a second dummy fill layer disposed on a fifth dielectric layer located under the first dielectric layer.

8. The thin film resistor structure of claim 7 wherein the second dummy fill layer is disposed on a planar surface of the fifth dielectric layer.

9. The thin film resistor structure of claim 8 wherein the first dummy fill layer is metal and the second dummy fill layer is polycrystalline silicon.

10. The thin film resistor structure of claim 2 including a second metal interconnect layer on the fourth dielectric layer including a first portion electrically coupled to the first portion of the first metal interconnect layer.

11. The thin film resistor structure of claim 2 wherein thin film resistor is composed of material from the group including SiCr, alloys of SiCr, NiCr, alloys of NiCr, TaN, and alloys of TaN.

12. The thin film resistor structure of claim 1 wherein the first dummy fill layer extends sufficiently far beyond ends of the thin film resistor to ensure that there is only a negligible amount of systematic resistance error due to misalignment error between the thin film resistor and the first dummy fill layer.

13. The thin film resistor structure of claim 2 wherein the thin film resistor includes a plurality of identical, parallel thin film resistor sections coupled in series.

14. The thin film resistor structure of claim 13 wherein the thin film resistor also includes first and second thin film dummy resistor sections which are located on opposite sides, respectively, of the plurality of series-coupled thin film resistor sections to avoid edge effects, wherein the first and second thin film dummy resistor sections are not electrically connected to any of the plurality of series-coupled thin film resistor sections.

15. A method of making an integrated circuit thin film resistor structure, the method comprising:
   forming a first dummy fill layer on a planar surface of a first dielectric layer;
   forming a second dielectric layer on the first dummy fill layer, and chemically mechanically polishing the surface of the second dielectric layer,
   forming a third dielectric layer over the first dummy fill layer, the third dielectric layer being disposed on the chemically mechanically polished surface and having a major planar surface, wherein the planar surface of the third dielectric layer is a non-abraded surface;
   forming a thin film resistor on the non-abraded surface of the third dielectric layer;
   forming a first inter-level dielectric layer on the thin film resistor; and
   forming a first metal layer on the first inter-level dielectric layer, a first portion of the first metal layer electrically contacting a portion of the thin film resistor through a contact opening in the first inter-level dielectric layer.

16. The method of claim 15 including forming a second interlevel dielectric layer on the first interlevel dielectric layer and first metal layer.

17. The method of claim 16 including forming a second metal layer on the second interlevel dielectric layer, a first portion of the second metal layer being electrically coupled through a via to the first portion of the first metal layer.

18. The method of claim 17 including forming a dielectric cap layer on the second interlevel dielectric layer and the second metal layer.

19. An integrated circuit thin film resistor structure made by the process comprising:
   forming a first dummy fill layer on a planar surface of a first dielectric layer;
   forming a planar dielectric layer over the first dummy fill layer, the planar dielectric having a non-abraded, major surface;
   forming a thin film resistor on the non-abraded, major surface of the planar dielectric layer;
   forming a first inter-level dielectric layer on the thin film resistor; and
   forming a first metal layer on the first inter-level dielectric layer, a first portion of the first metal layer electrically contacting a portion of the thin film resistor through a contact opening in the first inter-level dielectric layer.

* * * * *